United States Patent
Miyata (10) Patent No.: US 10,256,288 B2
(45) Date of Patent: Apr. 9, 2019

(54) NONVOLATILE MEMORY DEVICE

(71) Applicant: National Institute of Advanced Industrial Science and Technology, Tokyo (JP)

(72) Inventor: Noriyuki Miyata, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 15/769,629

(22) PCT Filed: Aug. 25, 2016

(86) PCT No.: PCT/JP2016/074797
§ 371 (c)(1),
(2) Date: Apr. 19, 2018

(87) PCT Pub. No.: WO2017/068859
PCT Pub. Date: Apr. 27, 2017

(65) Prior Publication Data
US 2018/0308854 A1    Oct. 25, 2018

(30) Foreign Application Priority Data
Oct. 20, 2015 (JP) .................... 2015-206749

(51) Int. Cl.
*H01L 49/02* (2006.01)
*H01L 27/10* (2006.01)
(Continued)

(52) U.S. Cl.
CPC .............. *H01L 28/56* (2013.01); *H01L 27/10* (2013.01); *H01L 27/11521* (2013.01);
(Continued)

(58) Field of Classification Search
CPC ............... H01L 27/112–27/11597; H01L 2924/145–2924/1453;
(Continued)

(56) References Cited

U.S. PATENT DOCUMENTS 6,900,498 B2 * 5/2005 Stauf ................ H01L 21/28291
257/295
9,536,940 B2 * 1/2017 Song ................ H01L 27/10852
(Continued)

FOREIGN PATENT DOCUMENTS

JP    2005-533371 A    11/2005
JP    2009-182252 A    8/2009
(Continued)

OTHER PUBLICATIONS

International Search Report for PCT Serial No. PCT/JP2016/074797 dated Aug. 25, 2016.

*Primary Examiner* — Scott B Geyer
(74) *Attorney, Agent, or Firm* — McCormick, Paulding & Huber LLP (57) ABSTRACT

A nonvolatile memory device can be manufactured without adding any major modification to a structure and component elements of a conventional MOS type silicon device, and is realized without deteriorating an electrical characteristic of an insulating-film/semiconductor interface and on the basis of a new operational principle. The nonvolatile memory device 10 is a capacitor configured by a metal electrode 16, two kinds of insulating films 13 and 15, and an interface structure of an insulating film 12/semiconductor 11, and has a MIS structure of providing a monolayer-level O-$M_1$-O layer 14 to an insulating-film 13/semiconductor 15 interface. The nonvolatile memory device 10 realizes a nonvolatile information storage operation by changing strength or polarities of interface dipoles induced near the O-$M_1$-O
(Continued)

layer 14 through electrical stimulation applied from a gate electrode.

6 Claims, 9 Drawing Sheets

(51) Int. Cl.
- *H01L 29/788* (2006.01)
- *H01L 29/792* (2006.01)
- *H01L 27/11521* (2017.01)
- *H01L 29/51* (2006.01)

(52) U.S. Cl.
CPC .......... *H01L 29/517* (2013.01); *H01L 29/788* (2013.01); *H01L 29/7882* (2013.01); *H01L 29/792* (2013.01)

(58) Field of Classification Search
CPC .......... H01L 28/55–28/57; H01L 29/94; G11C 17/02–17/126; H01G 4/08–4/129
See application file for complete search history.

(56) References Cited

U.S. PATENT DOCUMENTS

| | | | |
|---|---|---|---|
| 2002/0115252 A1* | 8/2002 | Haukka | C23C 16/40 438/240 |
| 2004/0001778 A1 | 1/2004 | Chen et al. | |
| 2004/0046197 A1* | 3/2004 | Basceri | H01L 21/3141 257/296 |
| 2007/0138529 A1* | 6/2007 | Basceri | H01L 21/3141 257/301 |
| 2013/0244016 A1* | 9/2013 | Osada | G11C 11/22 428/216 |
| 2014/0061756 A1 | 3/2014 | Tanaka et al. | |

FOREIGN PATENT DOCUMENTS

| | | |
|---|---|---|
| JP | 2014053371 A | 3/2014 |
| JP | 2015-060911 A | 3/2015 |

* cited by examiner

MULTI-LAYER DIPOLE FET

MULTI-LAYER DIPOLE CAPACITOR

NONVOLATILE MEMORY DEVICE

CROSS-REFERENCE TO RELATED APPLICATIONS

This application is a National Stage application of International Patent Application No. PCT/JP2016/074797, filed on Aug. 25, 2016, which claims priority to Japanese Patent Application No. 2015-206749, filed on Oct. 20, 2015, each of which is hereby incorporated by reference in its entirety.

TECHNICAL FIELD

The present invention relates to a nonvolatile memory device, particularly, a nonvolatile memory device to which intensity modulation of dipoles is applied, the dipoles being induced at an interface that is formed by two different insulating films.

BACKGROUND

Expanded are markets of semiconductor storage devices using NAND-type flash memories as information storage devices incorporated into information appliances such as mobile terminals. The NAND-type flash memory is an element having features of not only high integration and capacity enlargement but also nonvolatile information memory, and research and development of the NAND-type flash memories are currently advanced about capacity enlargement or high performance due to mainly device scaling and three-dimensional structural technologies.

The NAND-type flash memories have approached a physical limit of device scaling for memory operations in principle due to influences etc. of parasitic capacities. Although introduction into those three-dimensional structures is started, problems similar to the above have not been solved. Continuous development for high density and high performance cannot be expected to advance hereafter. Particularly, low rewrite endurance and low reading/writing speed are recited as demerits of the NAND-type flash memory. If those demerits are overcome, information storage devices having high reliability at high speed can be realized, and are expected to spread over wider ranges of application than that of the current NAND-type flash memories.

Under such a situation, a nonvolatile memory operation of utilizing modulation of interface dipoles is proposed as a memory operation that can be manufactured without adding significant changes to a structure and a component element(s) of a MOS-type silicon device such as a conventional NAND flash memory and that can be expected to have high performance exceeding the performance of the NAND flash memory (Japanese Patent Application Laid-open No. 2015-60911).

SUMMARY

However, in a memory structure disclosed in Japanese Patent Application Laid-open No. 2015-60911, a metal element(s) playing a role of a modulation operation is arranged closely to a semiconductor surface, so that an increase in interface state density of an insulating-film/semiconductor structure is concerned. If the memory structure is incorporated into a transistor structure, this brings degradation in electrical characteristics and there is a possibility that an application range will be limited.

The present invention is an invention made in view of the above, and its object is to provide a nonvolatile memory device that further improves the memory structure disclosed in Japanese Patent Application Laid-open No. 2015-60911 and that can be expected to have higher performance than that of the conventional NAND-type flash device.

A nonvolatile memory device according to the present invention realizes a nonvolatile memory operation of utilizing dipoles induced at two different insulating-film/insulating-film interfaces instead of the modulation operation of the dipoles at the metal-oxide-film/semiconductor interface disclosed in Japanese Patent Application Laid-open No. 2015-60911. More specifically, the nonvolatile memory device has a monolayer-level O-$M_1$-O layer at the insulating-film/insulating-film interface, and information is memorized by changing strength or polarities of interface dipoles induced near the O-$M_1$-O layer.

The present invention makes it possible to incorporate a dipole modulation mechanism onto an insulating-film/semiconductor structure having low interface state density, and to realize a nonvolatile memory device having little influence on operational characteristics of a field effect type transistor for reading and having high performance.

Further, it is reported that the dipoles occurring at various insulating-film/insulating-film interfaces are smaller than large dipoles (~1 V) induced at the metal-oxide-film/semiconductor interface. For this report, even if the dipole modulation is realized on the insulating-film/insulating-film interface, a voltage modulated width for its information storage is expected to be 0.2 V or smaller, and it is worried that sufficient performance may not be obtained as the nonvolatile memory device. Therefore, a new capacitor structure (insulating-film layered structure) in which multiple interface dipole layers are stacked is proposed by the present invention.

According to the present invention, a metal/multilayer-layered-insulating-film/semiconductor capacitor structure realizes a nonvolatile memory device that: can secure a large memory window without influencing electrical characteristics of an insulating-film/semiconductor interface on the basis of a modulation operation of interface dipoles due to atom transfer in a monolayer-level and extremely narrow range near an insulating-film/insulating-film interface by external electrical stimulus; can be manufactured without adding any major modification to a structure and a component element(s) of a silicon device such as a conventional NAND flash memory; and further can be expected to have high performance exceeding performance of the NAND flash memory.

DETAILED DESCRIPTION

Figure 1:
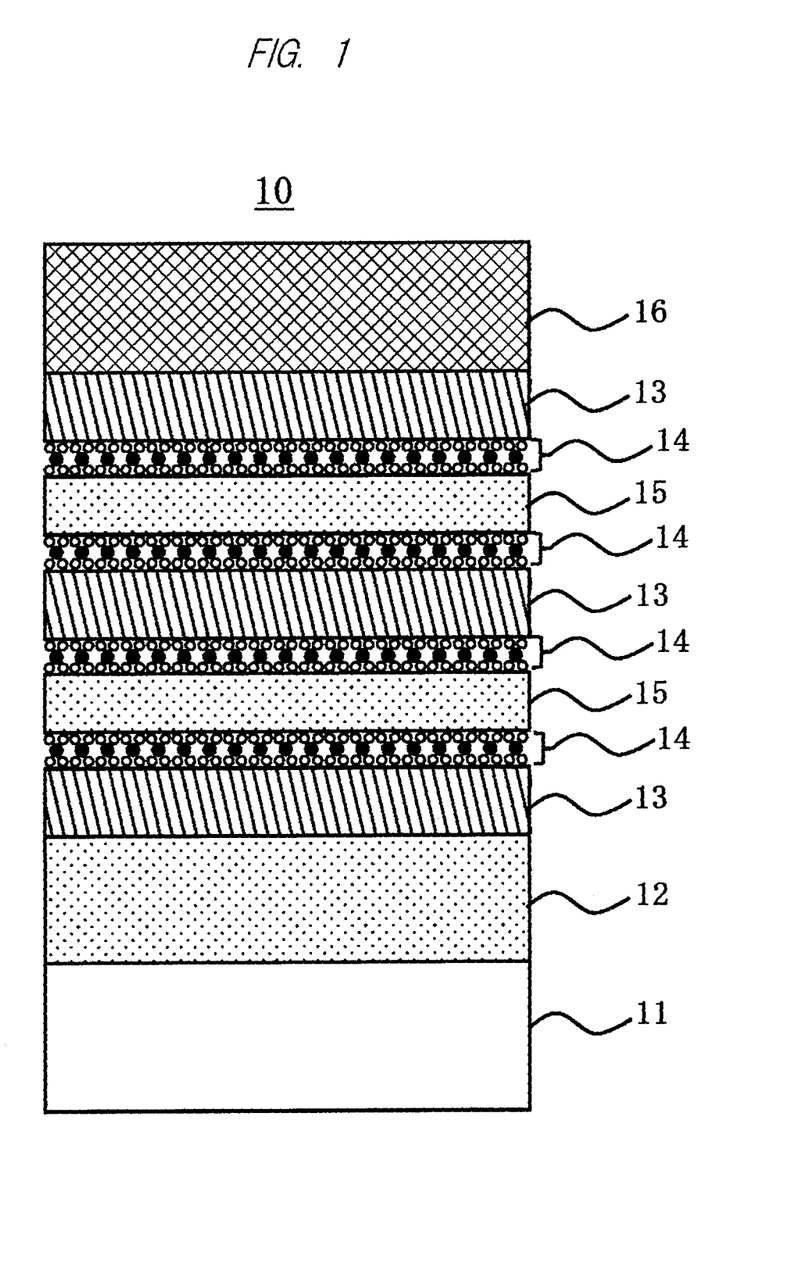
FIG. 1 is a cross-sectional structural drawing of one embodiment about a nonvolatile memory device according to the present invention.

FIG. 1 is a cross-sectional structural drawing of one embodiment about a nonvolatile memory device according to the present invention. In the same drawing, a nonvolatile memory device 10 of the present embodiment is formed on a semiconductor substrate 11 by: making, on the semiconductor substrate, an insulating film 12 having low interface state density; and laminating an insulating film 13, a monolayer-level $O$-$M_1$-$O$ layer 14, an insulating film 15, the monolayer-level $O$-$M_1$-$O$ layer 14 on the insulating film 12 in this order. There is a metal insulator semiconductor (MIS) capacitor structure that has a cross-section obtained by: stacking thereon and making a layered structure similar to the above; and finally forming a metal electrode 16 on the insulating film 13. That is, the nonvolatile memory device 10 has the MIS structure configured by a semiconductor substrate 11 and a multi-layered structure composed of the metal electrode 16, insulating films 12, 13, and 15, and the monolayer-level $O$-$M_1$-$O$ layer 14.

The semiconductor substrate 11 is, for example, silicon, and the insulating-film/semiconductor structure having low interface state density can be formed by using, as the insulating film 12, a silicon oxide film formed through thermal oxidation of silicon. The monolayer-level $O$-$M_1$-$O$ layer 14 is made by a chemical bond of monolayer-level oxygen (O)-metal element ($M_1$)-oxygen (O). The metal element ($M_1$) is provided, as schematically shown by black circles of FIG. 1, to bond the upper and lower insulating films 13 and 15 sandwiching the oxygen (O) shown by white circles. Metal elements other than elements contained in the insulating films 13 and 15 are used as the metal element ($M_1$). Used as the metal element ($M_1$) can be, for example, one or more of magnesium, titanium, strontium, yttrium, lanthanum, tantalum, gallium, and antimony. Used as each of the insulating films 13 and 15 can be, for example, a combination of oxide silicon ($SiO_2$) and hafnium oxide ($HfO_2$). Incidentally, besides $SiO_2$ and $HfO_2$, two or more of oxides such as germanium oxide ($GeO_2$), zirconium oxide ($ZrO_2$), lanthanum oxide ($La_2O_3$), aluminum oxide ($Al_2O_3$), and yttrium oxide ($Y_2O_3$) can be also combined.

Figure 2:
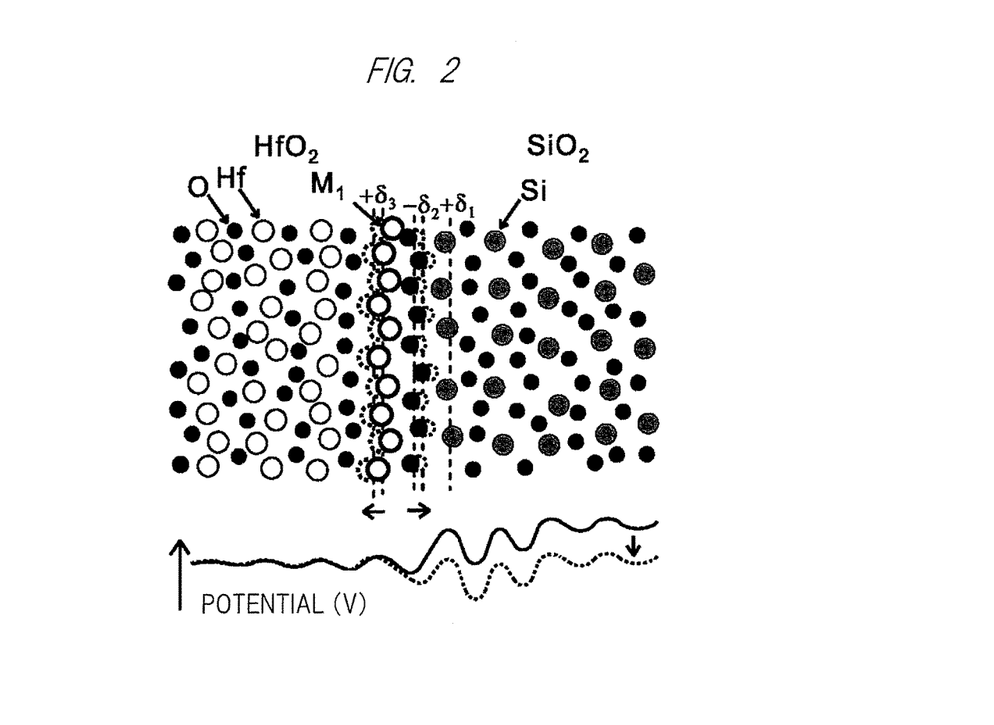
FIG. 2 is an explanatory diagram about dipole modulation due to occurrence of interface dipoles and atom transfer near an interface in an $HfO_2/SiO_2$ structure in which the interface has a monolayer-level O-$M_1$-O layer.

FIG. 2 explains an operation principle of the present invention by exemplifying an $HfO_2/SiO_2$ structure whose interface has a monolayer-level $O$-$M_1$-$O$ bond. Dielectric constants vary on atomic scale near a bonding interface of $SiO_2$ and $HfO_2$ similarly to that of a $HfO_2/Si$ interface, and positively charged Hf atoms and negatively charged O atoms due to ionic bonds cause a small potential variation to occur in $HfO_2$ ($\varepsilon$: ~20) having a large dielectric constant. However, positive Si atoms and negative O atoms cause a large potential variation to occur in $SiO_2$ ($\varepsilon$: ~3.9) having a small dielectric constant. Near the $HfO_2/SiO_2$ interface, a potential variation of the $O$-$M_1$-$O$ bonding layer bonded on a $HfO_2$ side is small, but a large potential difference occurs in an O—Si bond bonded on an $SiO_2$ side. Therefore, it is presumed that a potential difference between the $HfO_2$ and $SiO_2$ films, i.e., interface dipole is induced.

By changing positions of O and $M_1$ atoms near the interface by electric stimulation from outside, it is presumed that interface dipoles can be modulated in FIG. 2. For example, assumed is a MIS capacitor in which a gate electrode and a Si substrate are arranged on the $SiO_2$ side and the $HfO_2$ side in FIG. 2, respectively. When the gate electrode is applied to a positive voltage, forces in arrow directions of FIG. 2 exert on O and $M_1$ atoms near the interface. Even if atom transfer is slight on atomic scale, a large variation occurs from a potential distribution shown by a solid line of FIG. 2 to a broken-line potential distribution. Subsequently, when the gate electrode is applied to a negative voltage, the atomic transfer occurs in directions opposite to the arrow directions, and it is presumed that such atomic transfer returns to the original solid-line potential distribution. Since the interface dipoles are modulated by controlling from the gate electrode like the above, it is thought that operations of nonvolatile memories become possible.

An embodiment of the present invention will be concretely explained. An embodiment (MIS capacitor) of a nonvolatile memory device according to the present invention shown in FIG. 3 can be easily manufactured by using a deposition method capable of suppressing surface reactions due to electron beam evaporation etc. Additionally, surface coverage of $M_1$ atoms can be confirmed by an X-ray photoelectron spectroscopy. Here, explained as an example of the manufacture will be a process of using the electron beam evaporation to form an $HfO_2/SiO_2$/monolayer-level $O$-$M_1$-$O$/$HfO_2$ layered structure on a $SiO_2/Si$ (100) structure.

Firstly, an n-type Si (100) substrate to be made a semiconductor substrate is heated at 900° C. in a dry oxygen atmosphere to form a $SiO_2$ film having a thickness of 2 to 10 nm. Subsequently, $HfO_2$ is deposited on the $SiO_2$ film by a thickness of 1 nm by the electron beam evaporation. Then, an $M_1O_x$ layer is formed by the electron beam evaporation in the same vacuum chamber, and is made a monolayer-level $O$-$M_1$-$O$ layer. Incidentally, $M_1O_x$ quantity is adjusted to become one molecule by using an X-ray photoelectron spectroscopy. Then, $SiO_2$ is deposited by a thickness of 1.2 nm by the electron beam evaporation, and thereafter $HfO_2$ is deposited by a thickness of 2 nm. After end of deposition of insulating films, defects in an oxide film(s) are reduced by heating at 450° C. in the same vacuum chamber. Further, immediately after a sample(s) is taken out from the vacuum chamber, gold is deposited, as an electrode(s), on a surface of the $HfO_2$ film by resistive heating evaporation, and manufacture of a MIS capacitor shown in FIG. 3 is ended.

Figure 3:
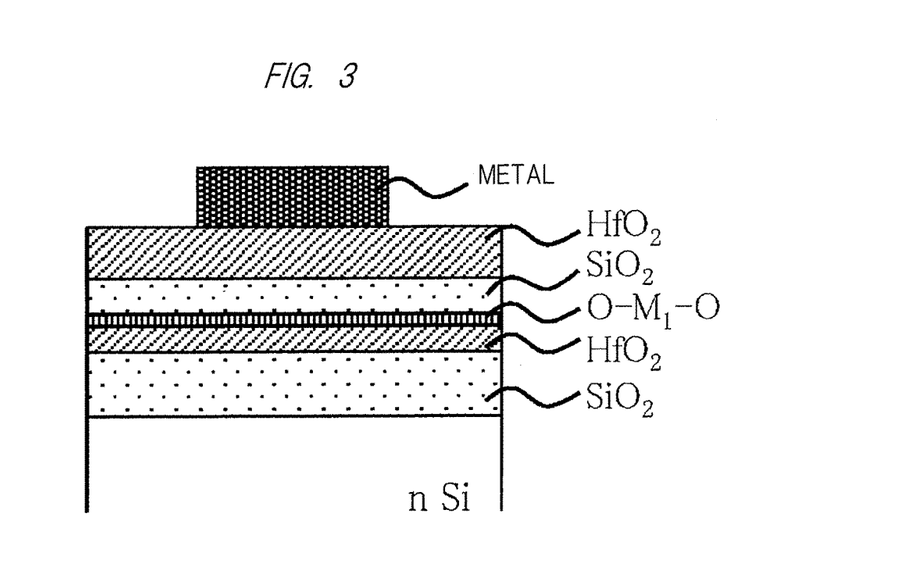
FIG. 3 is a cross-sectional structural drawing of one embodiment about a nonvolatile memory device according to the present invention.
Figure 4:
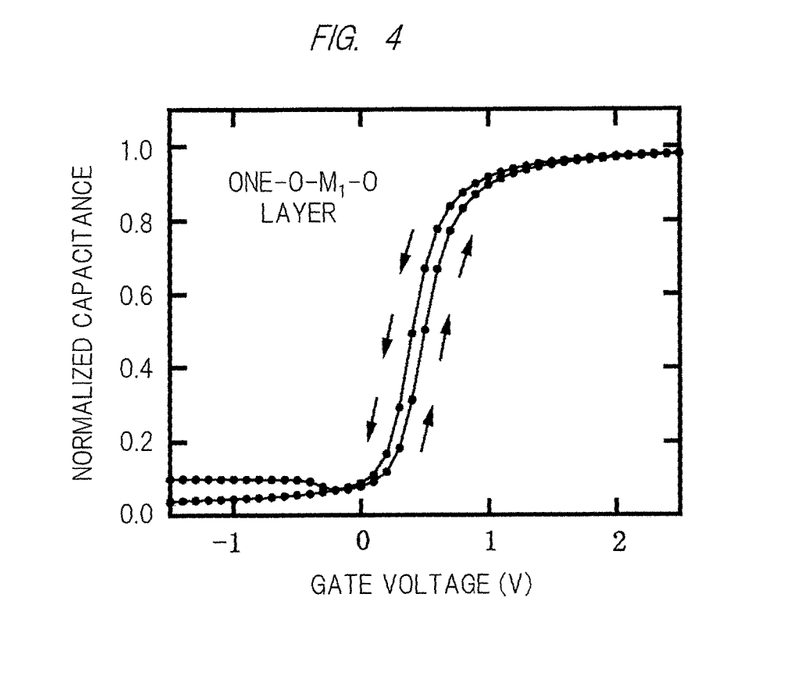
FIG. 4 is a diagram showing a capacitance-vs-gate-voltage characteristic that has been measured in a structure of one embodiment according to the present invention of FIG. 4.

FIG. 4 is an example of a capacitance-vs-gate-voltage characteristic (C-V characteristic) in a MIS capacitor having a monolayer-level $O-M_1-O$ bond on a $SiO_2/HfO_2$ interface manufactured and shown in FIG. 3. A vertical (or y) axis of FIG. 4 indicates values normalized by maximum capacitance, and a horizontal (or x) axis indicates gate voltages applied to a metal electrode. Here, a sweep of the gate electrode is firstly increased from −4.6 V to +5.4 V, and immediately thereafter is decreased from +5.4 V to −4.6 V. A sweeping range of this gate bias is set to a range of ±5 V from a flat band voltage ($V_{fb}$=+0.4 V) estimated by the initial capacitance measurement from 0 V.

As shown in FIG. 4, counterclockwise hysteresis characteristics are obtained from a structure of FIG. 3. It is rare that a general MIS capacitor shows the counterclockwise hysteresis characteristic like this. For example, if a positive gate voltage is applied when electric charge traps exist in the insulating film, electrons are injected into an insulating film side from a silicon substrate side and negative electric charges are formed in the insulating film, so that the C-V characteristic shows a clockwise hysteresis. The counterclockwise hysteresis has, for example, a structure of introducing a ferroelectric material into a gate stack structure and has an example caused by a reverse of a spontaneous polarization. Additionally, since the C-V characteristic about a metal-oxide-film/semiconductor structure having a monolayer-level $O-M_1-O$ bond on the interface of Japanese Patent Application Laid-open No. 2015-60911 also shows almost the same counterclockwise hysteresis characteristic, it is presumed that the interface dipoles are modulated. Thus, it can be presumed that the counterclockwise hysteresis of FIG. 4 is also derived from the modulation or reverse of the dipoles at the insulating-film/insulating-film interface.

Therefore, it is thought that the modulation operations of the interface dipoles shown in FIG. 2 are realized in the MIS capacitor of the present embodiment. Here, a hysteresis voltage ($V_{FB}$ difference) obtained from a sweeping width of $V_{fb}$±5 V of FIG. 4 is 0.1 V or less, whose value remains smaller than that of 0.5 V or more of the hysteresis voltage obtained by the dipole modulation of the metal-oxide-film/semiconductor interface of Japanese Patent Application Laid-open No. 2015-60911.

Weak strength of the dipoles of the original insulating-film/insulating-film interface can be recited as a cause for a low dipole modulation width measured from the structure of Embodiment 1 shown in FIG. 3. For example, the dipole layer at the $HfO_2/Si$ interface reach about 1 V, while the dipole layer at the $HfO_2/SiO_2$ interface are 0.2 V or less. It is reasonable that a large potential difference exists between $HfO_2$ and Si, as the Si—O bonds aligned on a crystalline Si surface contribute to formation of the dipoles. However, directions of chemical bonds at the amorphous-$HfO_2$/amorphous-$SiO_2$ interface are disturbed, so that a potential difference inevitably becomes small. So long as polarities of the dipoles are not inverted, the modulation exceeding the original interface dipoles is impossible, so that both differences can be said to be an inevitable result(s). Further, it is empirically known that a modulated width of the dipoles falls within about 50% of the strength of the original interface dipole layer. From the result(s) described above, it seems that the modulation of the dipoles at the $HfO_2/SiO_2$ interface slightly lacks in the modulated width in order to be used as the actual nonvolatile memory device.

Figure 5:
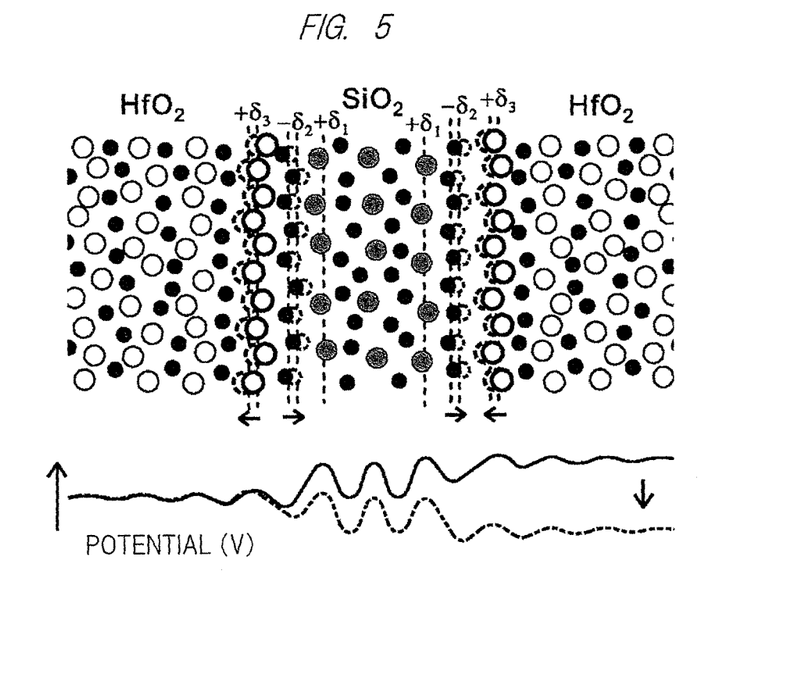
FIG. 5 is an explanatory diagram of dipole modulation due to atom transfer near each interface in an $HfO_2/SiO_2/HfO_2$-layered structure in which each interface has a monolayer-level $O$-$M_1$-$O$ layer.

In order to solve the lack of the modulated width of the dipoles, the present invention pays attention to an interface in a multilayer layered structure of the insulating film. As shown in Embodiment 1, each of both $SiO_2$ and $HfO_2$ has an amorphous structure, and so can be easily formed as a multiplayer structure without using an elaborate growth technique like a heteroepitaxial growth necessary for stacking crystalline layers. Here, when $HfO_2$ and $SiO_2$ films are stacked, two kinds of opposite interfaces composed of $HfO_2/SiO_2$ and $SiO_2/HfO_2$ are formed. In a cross-section of FIG. 5, for example, if it is assumed that a gate electrode and a Si substrate are respectively arranged on right and left sides of the drawing, an electric field generated from right to left in applying a positive voltage to the gate electrode results in two interfaces of the $HfO_2/SiO_2$ and $SiO_2/HfO_2$ traversing.

Here, considered will be a structure of arranging the same $O-M_1-O$ bonds on the both interfaces. Firstly, similarly to the atom transfer near the interfaces as explained by FIG. 2, when a positive voltage is applied to a gate electrode, oxygen and $M_1$ atoms slightly transfer near the both interfaces in FIG. 5 and in arrow directions, and it is presumed that a potential distribution shown by a solid line is shifted or varied to a potential distribution shown by a dotted line. Additionally, when a negative voltage is applied to the gate electrode, it is presumed that the dotted-line potential distribution is returned to the solid-line potential distribution. Meanwhile, a potential difference generated between the right and left $HfO_2$ is estimated to be close to about twice larger than that of a structure of having a single $O-M_1-O$ layer on the $SiO_2/HfO_2$ interface shown in FIG. 2. That is, the structure of having the $O-M_1-O$ bonds on both of the right and left interfaces is expected to be effective in an increase in the modulated width.

Figure 6:
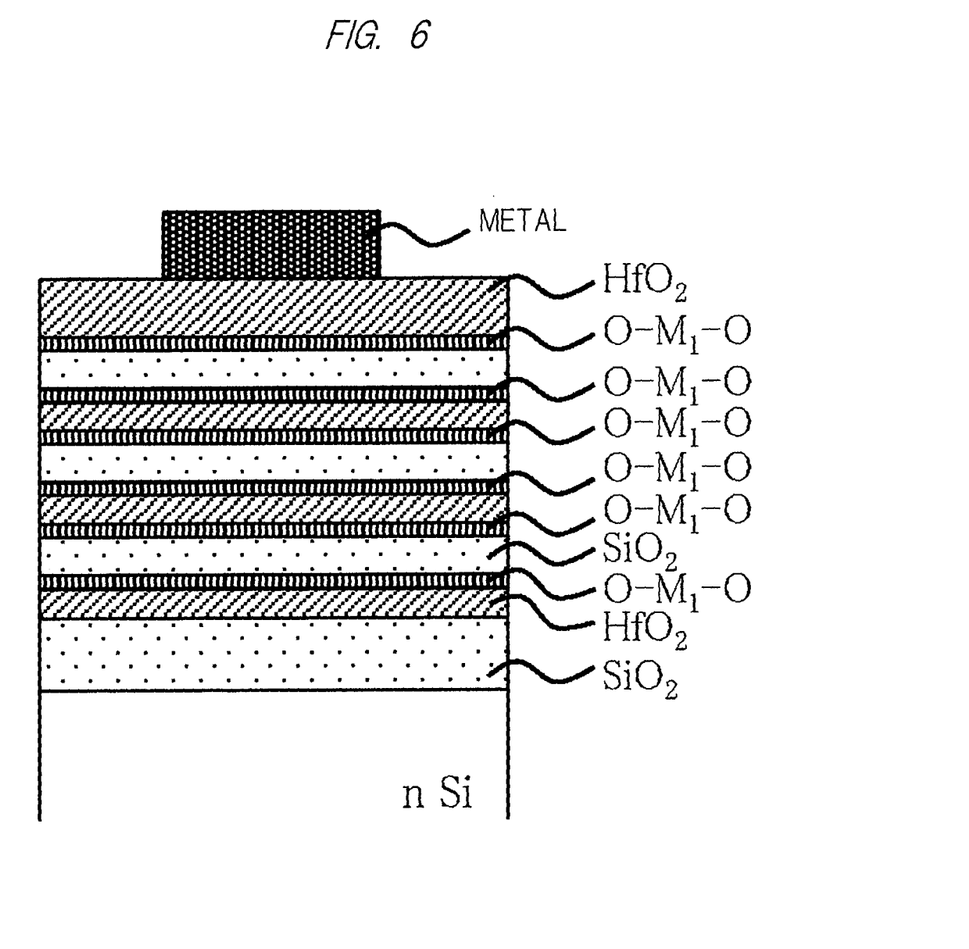
FIG. 6 is a cross-sectional structural drawing of one embodiment about a nonvolatile memory device according to the present invention.

A MIS capacitor according to an embodiment having a cross-sectional structure shown in FIG. 6 is a MIS capacitor manufactured by forming, on a $SiO_2/Si$ structure, an a $SiO_2/HfO_2$ layered structure with six $O-M_1-O$ bonding layers. It is formed on an n-type Si (100) substrate similarly to Embodiment 1. A $SiO_2$ film on Si is a silicon thermal oxide film having a thickness of 2 to 10 nm, which is manufactured by heating at 900° C. in a dry oxygen atmosphere. An $HfO_2$ film, a $SiO_2$ film, and a monolayer-level $O-M_1-O$ layer on the silicon thermal oxide film are deposited by electron beam evaporation. Firstly, an $HfO_2$ film having a thickness of 1 nm is deposited on the silicon thermal oxide film; thereafter, a monolayer-level $O-M_1-O$ layer is formed thereon; and then a $SiO_2$ film having a thickness of 1.2 nm is deposited thereon. Further, a monolayer-level $O-M_1-O$ layer is formed thereon, and then an $HfO_2$ film having a thickness of 0.6 nm is deposited thereon. By repeating a similar layered structure, a final $HfO_2$ film having a thickness of 2 nm is deposited, and formation of insulating films is ended. After ending the deposition of the insulating films, defects in an oxide film(s) are reduced by heating at 450° C. in the same vacuum device. Immediately after a sample(s) is taken out from the vacuum chamber, gold is deposited, as an electrode, on a surface of the $HfO_2$ film by resistive heating evaporation, and the manufacture of the MIS capacitor of FIG. 6 is completed.

Figure 7A:
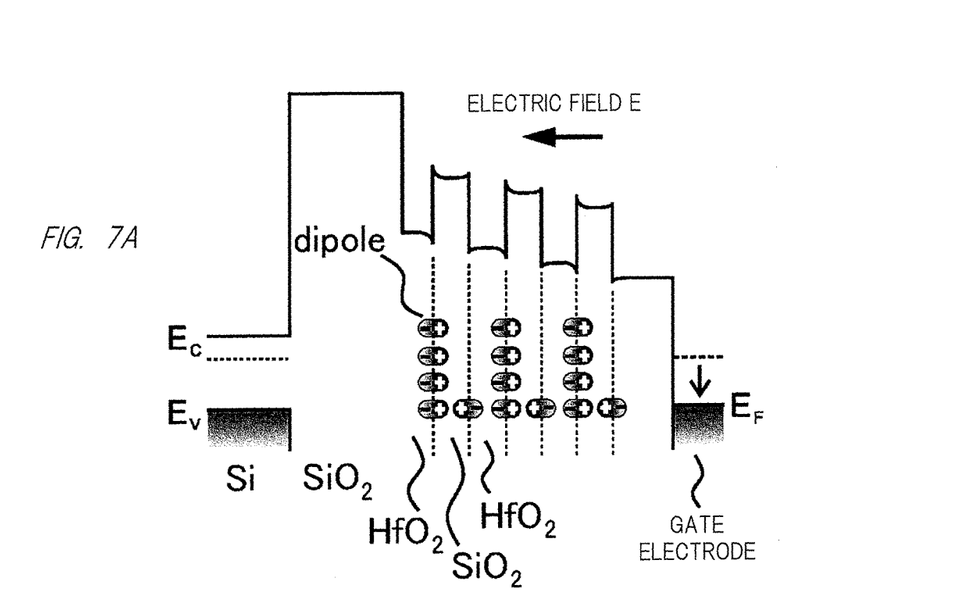
FIG. 7 is a band diagram for explaining a modulation operation of a MIS capacitor manufactured by forming an $HfO_2/SiO_2$ layered structure on a $SiO_2/Si$ structure, the $HfO_2/SiO_2$ layered structure including six $HfO_2/SiO_2$ modulation interfaces each of which has a monolayer-level $O$-$M_1$-$O$ layer on the $SiO_2/Si$ structure.
Figure 7B:
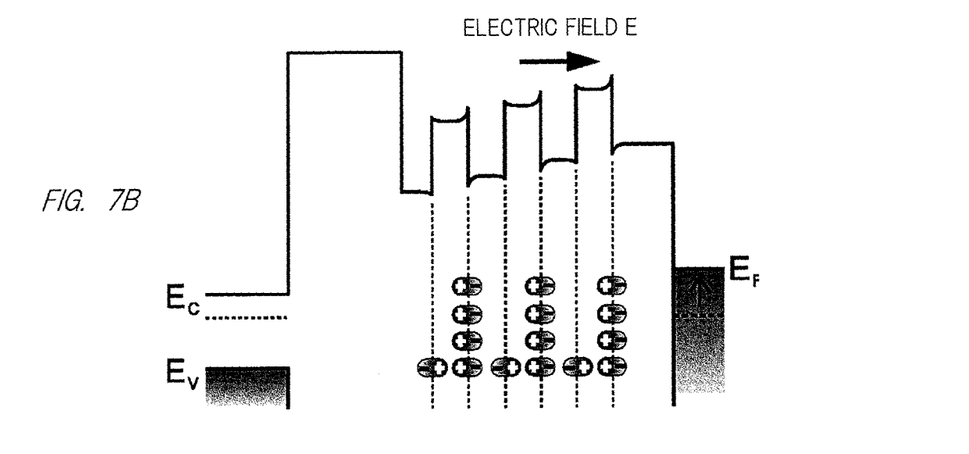

FIG. 7 shows a band alignment of an MIS capacitor having six $O-M_1-O$ layers exemplified by FIG. 6. When a positive voltage is applied to a gate electrode, as shown in (a) of FIG. 7, dipoles decrease on a SiO$_2$/HfO$_2$ interface to be arranged on a gate electrode side, and dipoles contrarily increase on a HfO$_2$/SiO$_2$ interface to be arranged on a Si substrate side. Meanwhile, when a negative voltage is applied to the gate electrode, as shown in (b) of FIG. 7, the dipoles increase on the SiO$_2$/HfO$_2$ interface on the gate electrode side, and the dipoles decrease on the HfO$_2$/SiO$_2$ interface on the Si substrate side. As a result, if the operation principle of the present invention is right, it is thought that the dipole modulated width corresponding to the six layers is added up and appears as a hysteresis voltage.

Figure 8:
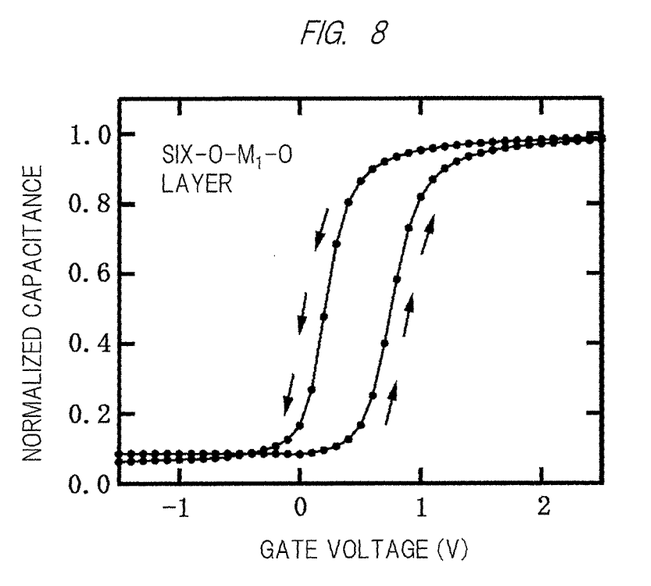
FIG. 8 is a diagram showing a capacitance-vs-gate-voltage characteristic that has been measured in a structure of one embodiment according to the present invention of FIG. 6.

FIG. 8 is an example of a C-V characteristic of a MIS capacitor having, on an insulating-film interface, a six-monolayer-level O-M$_1$-O bond manufactured and shown in FIG. 6. Here, V$_{fb}$=+0.4 V is estimated from the initial capacitance measurement from 0 V, so that a sweeping width of the gate voltage is set from −4.6 V to +5.4 V similarly to measurement conditions of FIG. 4. A counterclockwise hysteresis characteristic clearly appears as shown in FIG. 8, and its hysteresis voltage exceeds 0.5 V. Since the MIS capacitor having a one-monolayer-level O-M$_1$-O bond of FIG. 4 on the interface is 0.1 V or less, the hysteresis about six times larger is obtained as expected.

Meanwhile, the C-V characteristics of the two MIS structures shown in FIGS. 4 and 8 show a difference between the hysteresis widths as expected, but do not indicate precise comparison. This is because: since the number of HfO$_2$ layers is different from the number of SiO$_2$ layers, equivalent oxide thicknesses (EOT) of the MIS capacitors are different; and even if the width of the gate voltage is swept under the same condition(s), the electric fields applied inside the insulating films are different from each other in strength. Therefore, a comparison needs to be made based on the same electric field strength, and so measurement is made by the following procedure. Firstly, a gate voltage is decreased from 0V, and is applied up to a voltage of V$_{fb}$−3.5 V. Next, the voltage is swept to a positive voltage side and is returned on a negative voltage side after reaching a setting voltage, and a hysteresis voltage is estimated. At this time, an oxide film electric field is calculated from capacitance values at the setting voltage based on an ideal C-V curve. The similar measurement is repeated by causing the setting voltages to vary, and a characteristic of a change of the hysteresis voltage with respect to the maximum electric field applied to the oxide film can be obtained, so that the MIS capacitors different in EOT can be compared by using, as a benchmark, the strength of the electric field in the oxide film.

Figure 9:
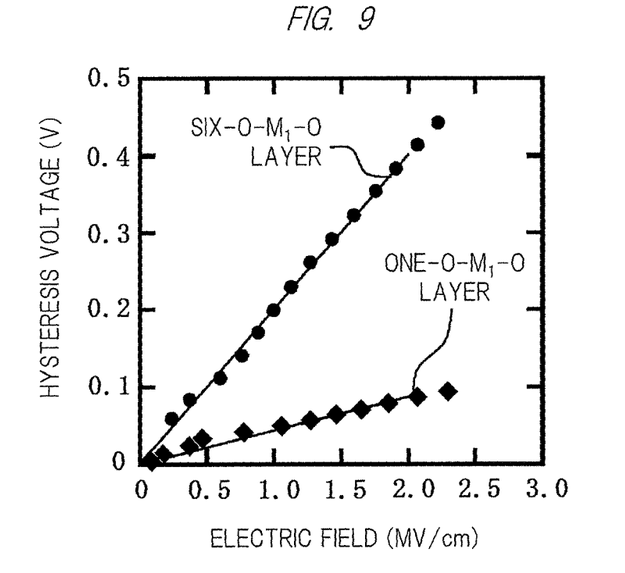
FIG. 9 is a diagram showing a hysteresis-voltage-vs-applied-electric-field characteristic that is measured at the maximum in a structure of one embodiment according to the present invention composed of FIG. 3 (one $O$-$M_1$-$O$ layer) and FIG. 6 (six $O$-$M_1$-$O$ layers)

FIG. 9 shows characteristics of hysteresis voltages with respect to an electric field that is obtained from the samples of Embodiment 1 shown in FIG. 3 and Embodiment 2 shown in FIG. 6. Both samples have increases in the hysteresis voltages in proportion to the electric fields, and this suggests that their atom transfer is an electric field driving type. When the one-O-M$_1$-O-layer and six-O-M$_1$-O-layer structures are compared, the six-O-M$_1$-O-layer structure obviously exceeds the one-O-M$_1$-O-layer structure about an increase rate of the hysteresis voltage, and this reaches the conclusion that the modulated widths of the dipoles are added up as expected.

Meanwhile, an object of the present invention is to incorporate, as mentioned above, a dipole modulation mechanism into a MIS structure without increasing the insulating-film/semiconductor interface state density. Therefore, the interface state density of the manufactured MIS capacitor is evaluated by a conductance method. Also measured for comparison by using the similar method is the HfO$_2$/SiO$_2$ capacitor having, on the interface, the monolayer-level O-M$_1$-O bond of Japanese Patent Application Laid-open No. 2015-60911 shown in FIG. 10.

Figure 10:
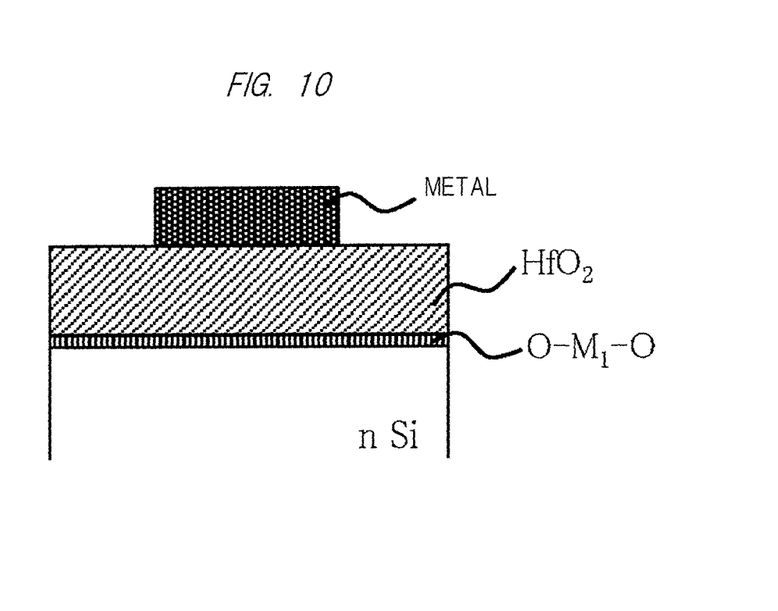
FIG. 10 is a cross-sectional structural drawing of one embodiment about a conventional nonvolatile memory device.
Figure 11:
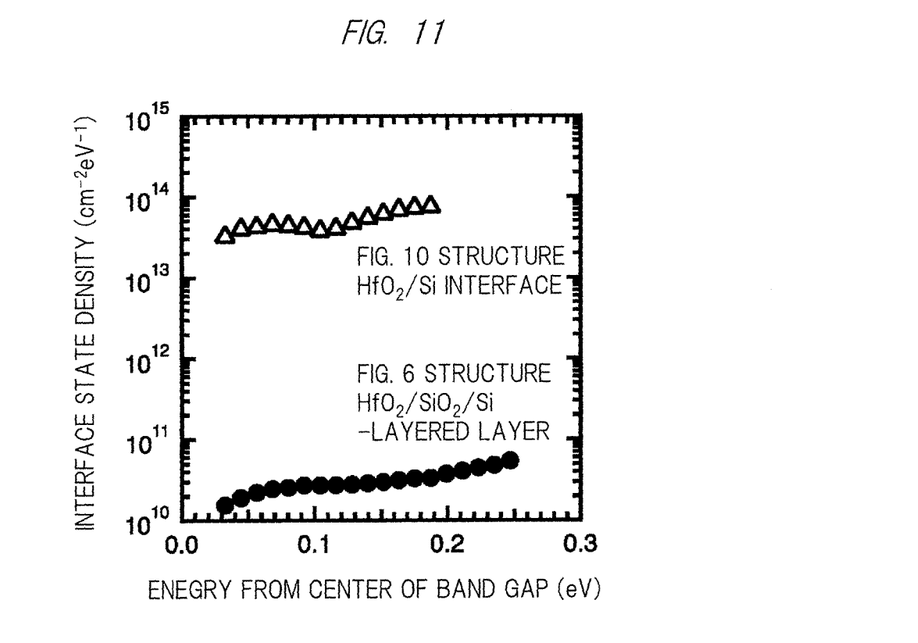
FIG. 11 is a diagram shown by comparing interface state densities near a mid gap, the interface state densities being measured about the structure of the embodiment according to the present invention of FIG. 6 and the conventional structure of FIG. 10.

FIG. 11 is a drawing shown by comparing interface state densities near a mid gap, the interface state densities being measured about the structure of the embodiment according to the present invention of FIG. 6 and the conventional structure of FIG. 10. The interface state density measured from the MIS structure of Japanese Patent Application Laid-open No. 2015-60911 exceeds a value of $1\times10^{13}$ cm$^{-2}$ eV$^{-1}$ near the mid gap, and this reaches the conclusion that the density includes a large interface state density. Meanwhile, the six-layer-structure MIS structure of FIG. 6 that is the present invention is shown so as to remain within a low interface-state-density range of $1\times10^{10}$ cm$^{-2}$ eV$^{-1}$. This value is such a low value as to compare with that of a SiO$_2$/Si interface generally used in a silicon MOS device, and this suggests that the bottom SiO$_2$/Si interface is hardly subjected to an influence(s) of the upper HfO$_2$/SiO$_2$ layered structure. Therefore, the present invention makes it possible to keep the low interface state density and incorporate, into the MIS structure, the dipole modulation mechanism having a memory window for utilizing the nonvolatile memory.

Figure 12:
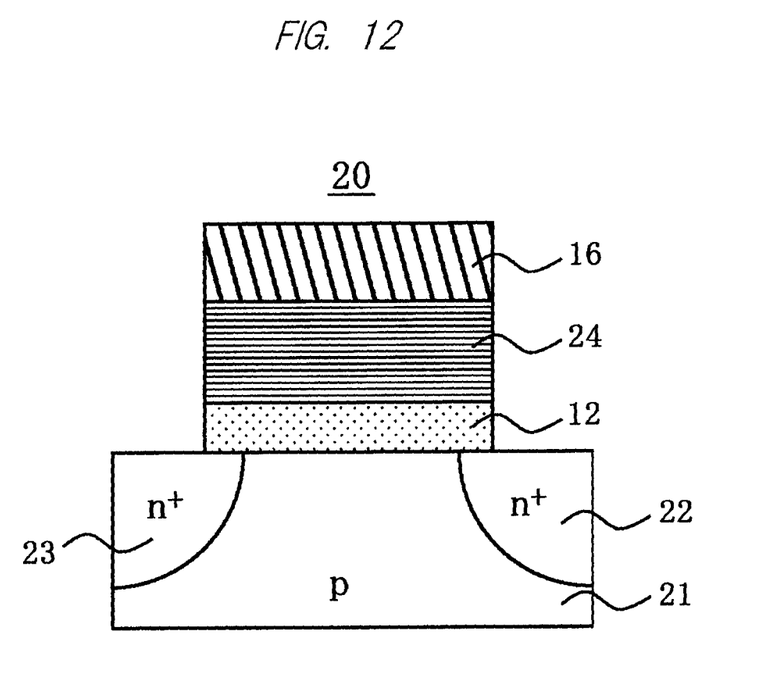
FIG. 12 is a cross-sectional structural drawing of another embodiment about a nonvolatile memory device according to the present invention.

Another embodiment of the present invention will be explained. FIG. 12 is a cross-sectional structural drawing of another embodiment about a nonvolatile memory device according to the present invention. A nonvolatile memory device 20 of the present embodiment in this drawing is a field effect type transistor having a structure in which interface dipoles are integrated into a gate stack structure. That is, in the nonvolatile memory device 20 of FIG. 12, n$^+$ semiconductor regions 22 and 23, which are separated from and oppose each other, are formed as a drain region and a source region on a p-type semiconductor substrate 21. Further, the nonvolatile memory device 20 is a field effect type transistor has a structure in which a multi-layer dipole structure 24 and metal electrodes 16 to be a gate electrode are stacked on an insulating film 12 on a surface of a p type channel. Incidentally, the metal electrode 16 may be polysilicon containing highly concentrated impurities. This field effect type transistor is a nonvolatile memory device having a three-terminal type metal/insulating-film/semiconductor structure that memorizes information by causing strength or polarities of interface dipoles in a multi-layer dipole structure to vary through electrical signals to be applied to the gate electrode.

Since the interface dipoles in an insulating-film layered structure in this nonvolatile memory device 20 are modulated, threshold voltages of the transistor vary, so that memorized information can be read out by variation of currents flowing between a source and a drain. For example, when the dipole modulation causes the threshold voltage shift of 0.5 V, and the interface state density is significantly small, it is presumed that a change in channel currents of six figures or more is observed.

The operational principle of the three-terminal type nonvolatile memory device 20 of the present embodiment utilizes the change in the threshold voltages due to the modulation of the interface dipoles, and is almost the same as the flash-memory operational principle that utilizes a change in threshold voltages due to electric charges trapped in the gate stack structure. Incidentally, the three-terminal type nonvolatile memory device 20 of the present embodiment does not need any special process technique(s) since its constituent elements are general as a silicon device, and so can be relatively easily introduced into a present flash-memory manufacturing process. Additionally, the present invention is not limited to the above-mentioned embodiment and, for example, the semiconductor substrate 21 and the semiconductor regions 22 and 23 in FIG. 12 may be an n type and p$^+$ types, respectively.

Figure 13A:
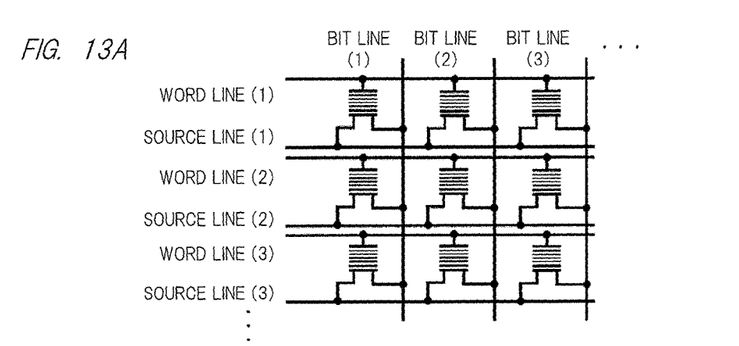
FIG. 13 is a drawing showing one embodiment about a memory cell array circuit using a nonvolatile memory device according to the present invention.

FIG. 13 is a drawing showing one embodiment about a memory cell array circuit using a nonvolatile memory device according to the present invention. FIG. 13(*a*) shows a cell array circuit using FET elements. This cell array circuit has a configuration in which cells are arranged at respective intersections of word and source lines wired in parallel to each other and bit lines perpendicular to the word and source lines. Each cell has a configuration in which a gate of a field effect type transistor (multi-layer dipole FET) having multi-layer dipoles represented by symbols in the drawing is connected to the word line; a source thereof is connected to the source line; and a drain is connected to the bit line.

Figure 13B:
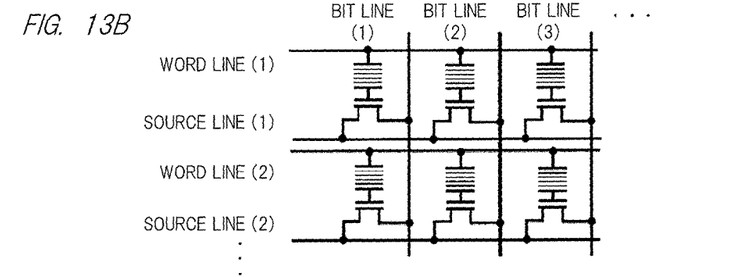

FIG. 13(*b*) shows a cell array circuit using an interface dipole modulation characteristic. This cell array circuit has a configuration in which cells are arranged at respective intersections of word lines and source lines wired in parallel to each other and bit lines perpendicular to the word and source lines. Each cell has a configuration in which a gate of the field effect transistor is connected to a capacitor (multi-layer dipole capacitor) having multi-layer dipoles represented by symbols in the drawing; a source of the field effect transistor is connected to the source line; and a drain is connected to the bit line. One of electrodes in the multi-layer dipole capacitor is connected to the gate of the field effect transistor, and the other electrode is connected to the word line.

Figure 13C:
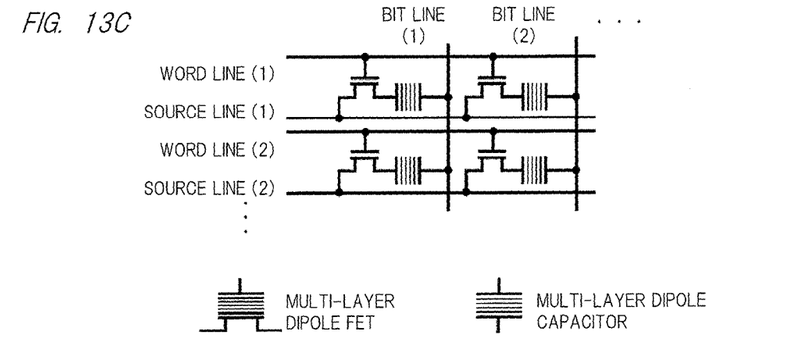

FIG. 13(*c*) shows a cell array circuit using a resistance change characteristic. This cell array circuit has a configuration in which cells are arranged at respective intersections of word and source lines wired in parallel to each other and bit lines perpendicular to the word and source lines. In each cell, a gate of a field effect transistor is connected to the word line, a source is connected to the source line, and a drain is connected to an electrode(s) of a multi-layer dipole capacitor in which the drain has a resistance change due to interface dipole modulation. One of electrodes in the multi-layer dipole capacitor is connected to the drain of the field effect transistor, and the other electrode is connected to the bit line.

The embodiments of the present invention have been described with reference to the drawings. However, the present invention is not limited to those embodiments. Further, the present invention can be embodied by embodiments in which various modifications and alterations are made based on knowledges of those skilled in the art within the scope of the present invention.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A nonvolatile memory device comprising a capacitor structure stacked on a semiconductor or metal,
   wherein the capacitor structure includes, on a bonding interface of two different insulating films, a monolayer-level O-$M_1$-O layer in which oxygen (O) and a metallic element ($M_1$) other than component elements of the insulating films are chemically bonded, and
   information is memorized by changing strength or polarities of interface dipoles induced near the monolayer-level O-$M_1$-O layer through external electrical stimulation.

2. The nonvolatile memory device according to claim 1, wherein each of the insulating films contains one oxide or more of oxide silicon, germanium oxide, hafnium oxide, zirconium oxide, lanthanum oxide, aluminum oxide, and yttrium oxide.

3. The nonvolatile memory device according to claim 1, wherein the metallic element ($M_1$) is one element or more of magnesium, titanium, strontium, yttrium, lanthanum, tantalum, gallium, and antimony.

4. The nonvolatile memory device according to claim 1, wherein the bonding interface having the O-$M_1$-O layer includes two interfaces or more.

5. The nonvolatile memory device according to claim 1, wherein the capacitor structure is formed on an insulating-film/semiconductor structure having low interface state density.

6. A three-terminal type nonvolatile memory device comprising:
   second-conductive type first and second semiconductor regions formed on a first-conductive type semiconductor substrate, the second-conductive type first and second semiconductor regions being separated from and opposing each other; and
   a gate structure body provided on a surface of the semiconductor substrate between the first and second semiconductor regions, the gate structure body comprising a capacitor structure and a metal electrode on the capacitor structure, the capacitor structure including a monolayer-level O-$M_1$-O layer on a two different insulating films, oxygen (O) and a metallic element ($M_1$) other than component elements of the insulating films being chemically bonded in the monolayer-level O-$M_1$-O layer; and
   a field effect transistor structure having the metal electrode serving as a gate electrode, and the first and second semiconductor regions respectively serving as drain and source regions,
   wherein information is memorized by changing strength or polarities of interface dipoles that the O-$M_1$-O layer induces through an electrical signal applied to the gate electrode.

\* \* \* \* \*